(12) United States Patent
Kawasaki

(10) Patent No.: US 6,285,433 B1
(45) Date of Patent: Sep. 4, 2001

(54) METHOD FOR MOUNTING TCP FILM TO DISPLAY PANEL

(75) Inventor: Kiyohiro Kawasaki, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/673,852

(22) PCT Filed: Feb. 22, 2000

(86) PCT No.: PCT/JP00/00991

§ 371 Date: Dec. 8, 2000

§ 102(e) Date: Dec. 8, 2000

(87) PCT Pub. No.: WO00/51100

PCT Pub. Date: Aug. 31, 2000

(30) Foreign Application Priority Data

Feb. 24, 1999 (JP) .................................................. 11-045626

(51) Int. Cl.[7] .............................. G02F 1/1345; G02F 1/13
(52) U.S. Cl. .......................... 349/149; 349/150; 349/152; 349/187
(58) Field of Search ..................................... 349/149, 150, 349/151, 152, 187; 257/59, 72

(56) References Cited

U.S. PATENT DOCUMENTS

| | | | |
|---|---|---|---|
| 5,680,191 | * | 10/1997 | Voisin et al. ........................ 349/150 |
| 5,689,352 | * | 11/1997 | Kishigami .......................... 349/149 |
| 5,734,458 | * | 3/1998 | Ikubo et al. ........................ 349/149 |
| 5,742,074 | * | 4/1998 | Takizawa et al. ..................... 257/59 |
| 5,771,084 | | 6/1998 | Fujimori et al. ..................... 349/153 |
| 5,835,177 | * | 11/1998 | Dohjo et al. ........................ 349/147 |
| 5,893,624 | * | 4/1999 | Matsuhira et al. .................... 349/152 |
| 5,933,206 | * | 8/1999 | Niibori et al. ....................... 349/152 |
| 6,147,724 | * | 11/2000 | Yoshii et al. ......................... 349/62 |
| 6,172,732 | * | 1/2001 | Hayakawa et al. ................... 349/152 |

FOREIGN PATENT DOCUMENTS

| | | |
|---|---|---|
| 60-225828 | 11/1985 | (JP) . |
| 62-281340 | 12/1987 | (JP) . |
| 63-316884 | 12/1988 | (JP) . |
| 5-224188 | 9/1993 | (JP) . |
| 5-315392 | 11/1993 | (JP) . |

* cited by examiner

Primary Examiner—William L. Sikes
Assistant Examiner—Tarifur R. Chowdhury
(74) Attorney, Agent, or Firm—Parkhurst & Wendel, L.L.P.

(57) ABSTRACT

When pressure-bonding a conductive pattern (12) of TCP film (4) to a terminal electrode (5) of an active substrate (2) via a photo-curing resin (23), a translucent resin (22) is filled into openings (21a, 21b) formed to penetrate an opaque film (20) and the conductive pattern (12) to complete pressure-bonding and light rays (30) are applied to the joint surfaces of the conductive pattern (12) and a connection terminal (5) via the translucent resin (22) from the side of the TCP film (4) where the pattern (12) is not formed to cure the photo-curing resin (23), whereby TCP film can be mounted to a liquid crystal panel at low temperatures.

9 Claims, 5 Drawing Sheets

METHOD FOR MOUNTING TCP FILM TO DISPLAY PANEL

TECHNICAL FIELD

The present invention relates to a method for mounting a TCP film to display panels such as a liquid crystal panel, a light-emitting type matrix panel and the like.

BACKGROUND ART

Because of the recent technological advancement in such areas as micro fabrication, liquid crystal material, packaging and the like, liquid crystal panels with a display screen measuring diagonally from 5 cm to 50 cm, which allow television pictures and various video images to be displayed flawlessly in practical use, are made available on a commercial basis.

Also, a liquid crystal panel, which displays images in color, is realized without difficulty by having one of the glass substrates, which constitute the liquid crystal panel provided with a RGB colored layer.

Particularly, with a liquid crystal panel having a switching element built in each respective pixel, the so -called active type liquid crystal panel, the displayed video images have little cross-talk, a quick response and a high contrast ratio.

Each of these liquid crystal panels has usually a matrix composition of 100 to 1000 scanning lines and 200 to 2000 signal lines, respectively, and an effort in development on both a larger screen size and a higher resolution has recently been under way to cope with the requirement for enhanced display capacity.

FIG. 4 is a perspective view of part of an active type liquid crystal panel and an active type liquid crystal panel 1 is formed of an active substrate 2 and an opposing substrate 9 with liquid crystal filled therebetween.

The active substrate 2 comprises:

a translucent insulating substrate;

a plurality of scanning lines disposed on one of the main surfaces of the translucent insulating substrate;

a plurality of signal lines intersecting generally at a right angle with the scanning lines;

at least one or more of insulating layer sandwiched between the scanning lines and the signal lines;

at least a switching element and a pixel disposed at each respective point of intersection of the scanning line and signal line; and a cluster of terminal electrodes of the scanning lines and signal lines disposed outside the image display area of the active substrate 2.

The opposing substrate 9 is formed of a glass substrate constituting a translucent insulating substrate having translucent and conductive opposing electrodes.

The active substrate 2 and opposing substrate 9 are separated from each other with a predetermined gap of about several micrometers maintained therebetween by means of such a spacer material as a resin fiber, resin bead and the like, and the space (gap) between the foregoing two substrates is sealed at the peripheral edges of the opposing substrate 9 by the use of a sealant and an encapsulating material, both formed of an organic resin, thereby creating a totally enclosed space, into which liquid crystal is filled.

Color displaying is performed by a color displaying function, which is served by an organic thin film of about 1 to 2 micrometers thick formed as a colored layer containing one selected from a dye and a pigment, or both, disposed on the surface of the opposing substrate 9 on the totally enclosed side. In this case, the glass substrate 9 is also referred to as a color filter.

Depending on the nature of a liquid crystal material, a polarizer is affixed on the upper surface of the opposing substrate 9 or the lower surface of the glass substrate 2, or on both thereof, thereby allowing the liquid crystal panel 1 to act as an electoptic element.

A majority of the liquid crystal panels now in use are a TN (twistnematic) type and each respective panel requires usually two polarizers.

With the liquid crystal panel structured as described in above, a semiconductor integrated circuit chip 3, for example, supplying a driving signal is directly connected to a terminal electrode cluster 6 of the scanning lines according to a COG (Chip-On-Glass) packaging method and a TCP film 4 is connected to a signal electrode cluster 5 of the signal lines and fixed thereon by pressing down a conductive adhesive applied to the connecting points according to a TCP (Tape-Carrier-Package) packaging method outside the image display area of the active substrate 2.

The TCP film 4 is formed of a polyimide resin of around 0.1 mm thick as the base, for example, with terminals made of a copper foil that is gold plated or solder plated. (The terminals are not shown in the drawing.)

For the sake of convenience, the two kinds of packaging method are illustrated on the drawing at the same time but one of the methods is selected as appropriate in practice.

The image display area of the liquid crystal panel 1 is connected with the terminal electrode cluster 5 of the signal lines and the terminal electrode cluster 6 of the scanning lines via wiring channels 7 and 8, respectively. However, the wiring channels 7 and 8 are not necessarily formed of the same conductive material as the terminal electrode clusters 5 and 6.

With the aforementioned liquid crystal panel, a liquid crystal cell comprises a translucent and conductive pixel electrode formed on the active substrate 2, a likewise translucent and conductive opposing electrode formed on the opposing substrate 9 and liquid crystal filled between the two glass substrates.

With an IPS type liquid crystal panel that has been recently put into market with the capability of expanding viewing angles, the translucent electrode (opposing electrode) is no longer required to be disposed on the color filter since the liquid crystal cell comprises a pair of comb like electrodes formed on one (active substrate) of the glass substrates and liquid crystal filled between the two glass substrates. However, a detailed description is not given here to this type liquid crystal panel.

In order to display video images on a liquid crystal panel, electrical signals are fed to terminal electrodes of both scanning lines and signal lines formed according to the aforementioned TCP or COG packaging methods. For a reduction in costs and/or enhancement in reliability involved with packaging by minimizing the number of connecting points, there have been increasing tendencies recently to make heavy use of the COG packaging method.

Although there are a variety of methods and means, by which packaging is performed according to TCP or COG, a typical packaging method that is most frequently employed is described here with reference to FIG. 5.

A plurality of terminal electrodes 5 (6) are disposed on the surface of the active substrate 2 and an insulating layer 15 including a gate insulating layer and a passivation insulating layer is disposed between the adjoining terminal electrodes 5 (6). The insulating layer 15 on each respective terminal electrode is eliminated selectively, thereby making almost all the surface area of each respective terminal electrode 5 (6) free of the insulating layer 15.

Next, after having the active substrate 2 and the color filter (not shown in FIG. 5) put together by adhesion into a panel form in a cell fabrication process, the active substrate 2 and the TCP film 4 with conductive patterns 12 (bump electrodes), each of which is plated with such a conductive material 11 as gold, solder and the like, are connected with each other by an application of pressure and heat via a thermosetting anisotropic conductive film (ACF) 14 containing conductive fine particles 13 in a packaging process.

The conductive patterns 12 (bump electrodes) formed of a copper foil and the base film of the TCP film 4 are joined together fixedly with an adhesive 16.

The conductive fine particle 13 serves as a conductive medium to have the conductive patterns 12 (bump electrodes) and the terminal electrodes 5 (6) connected one another electrically and a typical conductive fine particle 13 is formed of a plastic ball, the surface of which is plated with gold or nickel.

The anisotropic conductive rubber 14 makes a plurality of the conductive fine particles 13 contained therein coagulate and couple with one another to exhibit conductivity when a pressure is applied thereto, as FIG. 3 shows. Therefore, it is preferred to have the surface of any one of the two elements that are joined together made to appear like a convex shape.

With this anisotropic conductive film (ACE) packaging method, the sticking strength of the ACF is reduced when the ACF is heated at a relatively low temperature, thereby allowing the TCP film 4 or semiconductor integrated circuit chip 3 to be peeled off with a physical force. Therefore, the TCP film 4 or semiconductor integrated circuit chip 3 can be peeled off even after having been mounted on the active substrate 2 once and used again, thereby enabling the reworking or recycling of liquid crystal panels to be performed easily.

If no defects are found out with the packaging carried out at a reduced temperature, i.e., tentative packaging (tentative thermosetting), proper packaging (proper thermosetting) at an increased temperature takes place, thereby bringing the packaging process to an end.

As described in above, with the ACF packaging method, the heating process is mandatory. Generally, the reliability in packaging is enhanced as the temperature of the heat applied during the process of packaging is increased. This is assumedly due to an increased strength of the rubber caused by perfect evaporation or sublimation of the solvents contained in the ACF.

Various kinds of ACF materials are available from chemical companies such as Hitachi Chemical, Sony Chemical and the like. A Sony Chemical's product named "Anisorum", for example, is used at a tentative thermosetting temperature of 80° C. to 100° C. and at a proper thermosetting temperature of 180° C. to 200° C.

However, a high processing temperature required in a liquid crystal packaging process has been making it necessary for a polarizer to be attached by adhesion on a liquid crystal panel only after the packaging process. In addition, with a liquid crystal panel of a wide viewing angle, for which there is an increasingly strong demand from the market, it is found out recently that even a small amount of distortion existing in the optical path of a liquid crystal cell results in observing a brightness-dappled display because of an increase in the length of optical path when looked in a slanting direction and resultant difficulty involved with optical design conditions of liquid crystal panels.

Accordingly, the high processing temperature in the packaging process causes distortion to occur on the glass substrate 2 near the terminal electrodes 5 and 6 and creates a danger of the distortion to extend to the vicinity of the image display area, thereby making it necessary for the processing temperature in the packaging process to be lowered. Therefore, a proposal is made on a method for packaging at a low temperature by the use of an ultraviolet curing resin but, as far as the TCP packaging is concerned, there is no established technology to guide ultraviolet rays effectively to an area where packaging and connection take place, thereby creating a problem of making the adoption of an ultraviolet curing resin difficult.

The present invention deals with the foregoing problem and allows a method for mounting a TCP film to display panels at a low temperature to be made available.

SUMMARY OF THE INVENTION

A method for mounting a TCP film to display panels according to the present invention features an adoption of a TCP film structured specifically for enabling light rays to reach the joint surfaces between a conductive pattern on the TCP film and a terminal electrode when a photo-curing resin is used in mounting the TCP film to display panels.

According to the present invention, low temperature mounting of a TCP film can be realized and, even with a liquid crystal panel of a wide viewing angle, dappled patterns caused by a mounting tool are prevented from appearing.

A method for mounting a TCP film to display panels in a first exemplary embodiment of the present invention comprises a step of establishing connections between terminal electrodes of a liquid crystal panel, which is formed of an active substrate and an opposing color filter substrate with liquid crystal filled therebetween, and a TCP film, in which conductive patterns are formed on the surface of an opaque film substrate, wherein the active substrate comprises:

a first translucent insulating substrate;

a plurality of scanning lines disposed on one of the main surfaces of the first translucent insulating substrate;

a plurality of signal lines intersecting generally at a right angle with the scanning lines, respectively;

at least one or more of insulating layer sandwiched between the scanning lines and the signal lines;

at least a switching element and a pixel at each respective point of intersection of the scanning line and signal line; and terminal electrodes of the scanning lines and signal lines disposed outside the image display area of the active substrate, and wherein the color filter substrate opposing to the active substrate comprises:

a second translucent insulating substrate with a translucent conductive layer disposed on one of the main surfaces thereof; or the second translucent insulating substrate with a color filter layer formed thereon, and when the conductive patterns of the TCP film and the terminal electrodes are connected with one another via a photo-curing resin, the method for mounting a TCP film on display panels further comprises the steps of:

having an opening, which is formed over the opaque film and the conductive patterns, filled with a translucent resin and applied with a pressing force to establish connections between the conductive patterns of the TCP film and the terminal electrodes; and having light rays irradiated from the side opposite to the surface of the TCP film provided with the conductive patterns on the joint surfaces between the conductive patterns and the connecting terminals through the translucent resin to harden the photo-curing resin.

Thus, the translucent resin filling the opening formed over the opaque film and conductive patterns allows the light rays irradiated even from the top of the TCP film to reach the joint surfaces between the conductive patterns and the connecting terminals, thereby enabling the photo-curing resin to harden sufficiently.

A method for mounting a TCP film to display panels in a second exemplary embodiment of the present invention comprises a step of joining together terminal electrodes of a liquid crystal panel, which is formed of an active substrate and an opposing color filter substrate with liquid crystal filled therebetween, and a TCP film, in which conductive patterns are formed on the surface of a translucent film substrate,
wherein the active substrate comprises:
  a first translucent insulating substrate;
  a plurality of scanning lines disposed on one of the main surfaces of the first translucent insulating substrate;
  a plurality of signal lines intersecting generally at a right angle with the scanning lines, respectively;
  at least one or more of insulating layer sandwiched between the scanning lines and the signal lines;
  at least a switching element and a pixel at each respective point of intersection of the scanning line and signal line; and
  terminal electrodes of the scanning lines and signal lines disposed outside the image display area of the active substrate, and
wherein the color filter substrate opposing to the active substrate comprises:
  a second translucent insulating substrate with a translucent conductive layer disposed on one of the main surfaces thereof; or
  the second translucent insulating substrate with a color filter layer formed thereon, and
when an opening is formed on the conductive patterns of the TCP film and the conductive patterns of the TCP film and the terminal electrodes are joined together by pressing against one another via a photo-curing resin, the method for mounting a TCP film display panels further comprises the step of having light rays irradiated from the side opposite to the surface of the TCP film provided with the conductive patterns on the joint surfaces between the conductive patterns and the connecting terminals to harden the photo-curing resin, while keeping the conductive patterns pressed on the terminal electrodes, thereby completing the mounting of the TCP film to display terminals.

Thus, a translucent film used as the substrate of the TCP film and also a plurality of openings formed on the conductive patterns allows the light rays irradiated even from the top of the TCP film to reach the joint surfaces between the conductive patterns and the connecting terminals in the same way as above, thereby enabling the photo-curing resin to harden sufficiently.

A method for mounting a TCP film to display panels in a third exemplary embodiment of the present invention is as described in the first exemplary embodiment or the second exemplary embodiment, wherein a photo-curing resin containing conductive fine particles is used as the adhesive for joining the conductive patterns and connecting terminals together.

Accordingly, by having the conductive fine particles contained in the photo-curing resin, the conductive patterns and the connecting terminal are no longer required to be brought into direct contact with one another, thereby simplifying the process of mounting the TCP film by applying a pressing force thereto.

A method for mounting a TCP film to display panels in a fourth exemplary embodiment of the present invention is as described in any one of the first to third exemplary embodiments, wherein the display panel is any one of an IPS type liquid crystal panel that does not require translucent conductive pixel electrodes, a simple type liquid crystal panel with no active devices built in, a reflective type liquid crystal panel and a liquid crystal panel with a coloring layer for color display formed on the active substrate.

A method for mounting a TCP film on display panels in a fifth exemplary embodiment of the present invention is as described in any one of the first to third exemplary embodiments, wherein the display panel is a light emitting type matrix display panel such as a PDP, an EL panel and the like.

PREFERRED EMBODIMENTS OF THE INVENTION

Figure 2A:
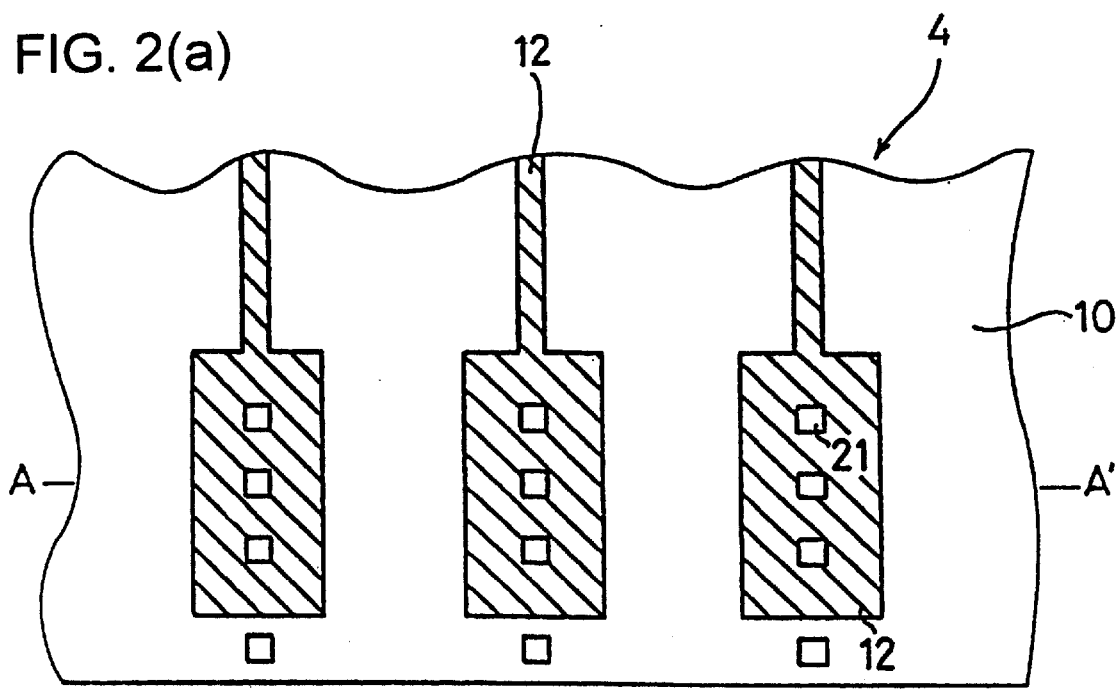
FIG. 2(a) is a plan view of a TCP film in the second exemplary embodiment of the present invention.
Figure 2B:
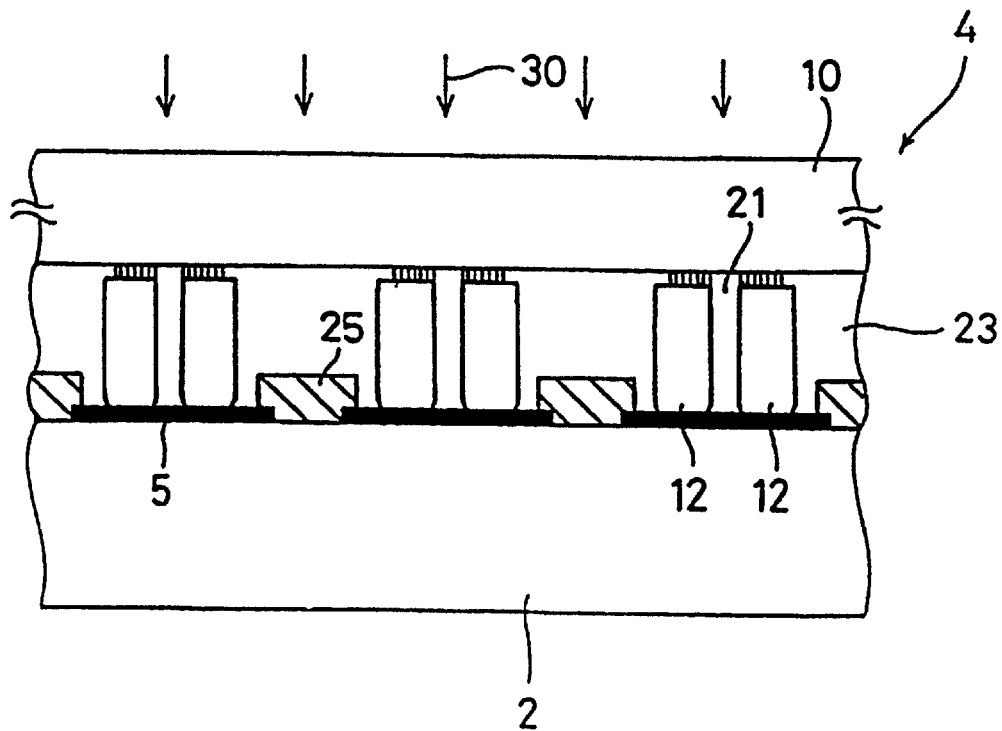
FIG. 2(b) is a cross-sectional view to illustrate a method for mounting the TCP film on an active substrate in the second exemplary embodiment.
Figure 3:
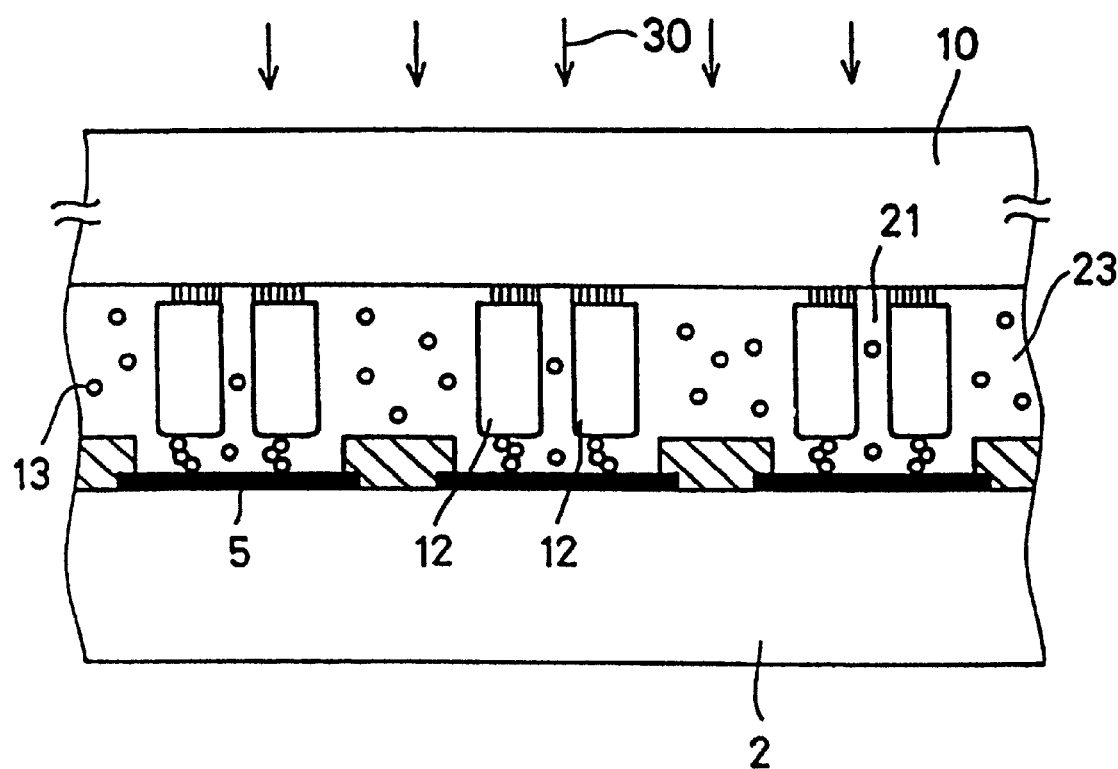
FIG. 3 is a cross-sectional view to illustrate the state of mounting a TCP film on an active substrate in the third exemplary embodiment of the present invention.
Figure 4:
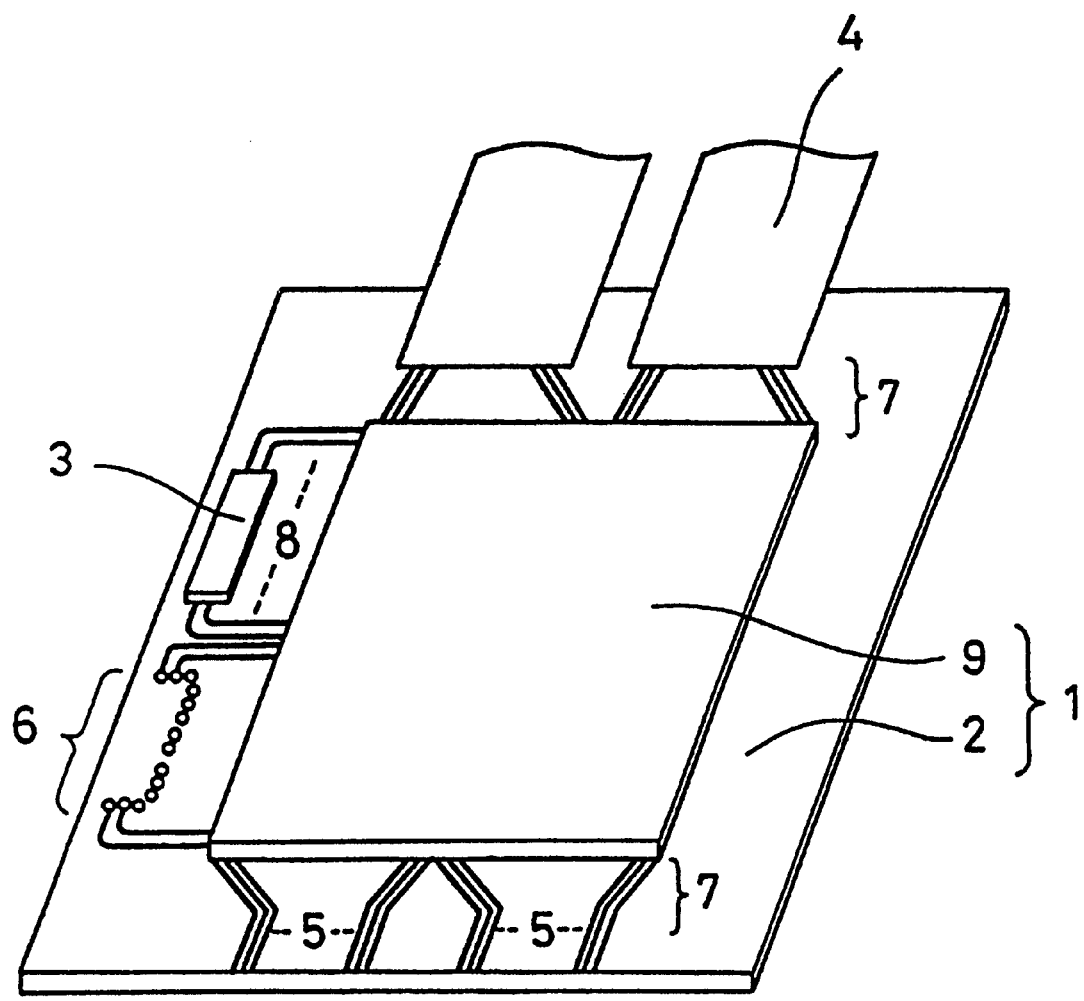
FIG. 4 is a perspective view of an active type liquid crystal panel.
Figure 5:
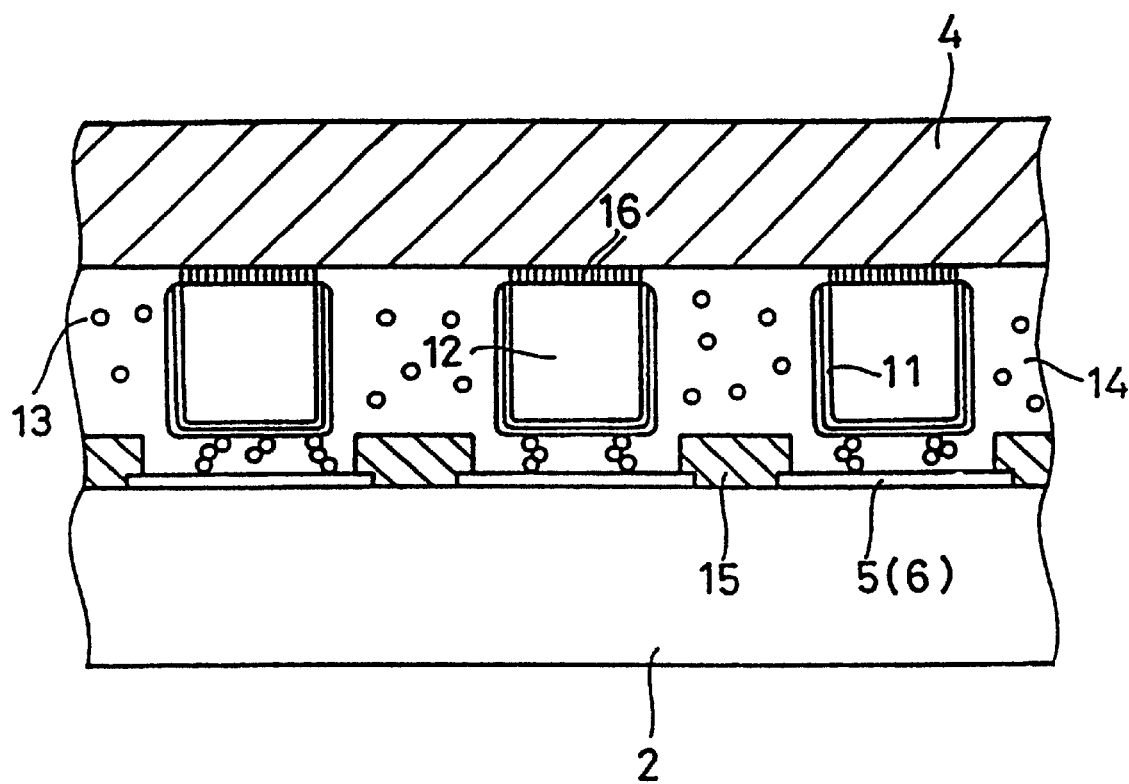
FIG. 5 is a cross-sectional view to illustrate the state of mounting a TCP film on an active substrate according to a prior art.

Next, a description is given to a method for mounting a TCP film on a display panel in a few preferred exemplary embodiments of the present invention with reference to FIG. 1 to FIG. 3, in which the same reference alphanumeric characters as used in FIG. 4 and FIG. 5 refer to the same parts of FIG. 4 and FIG. 5.

First Exemplary Embodiment

Figure 1A:
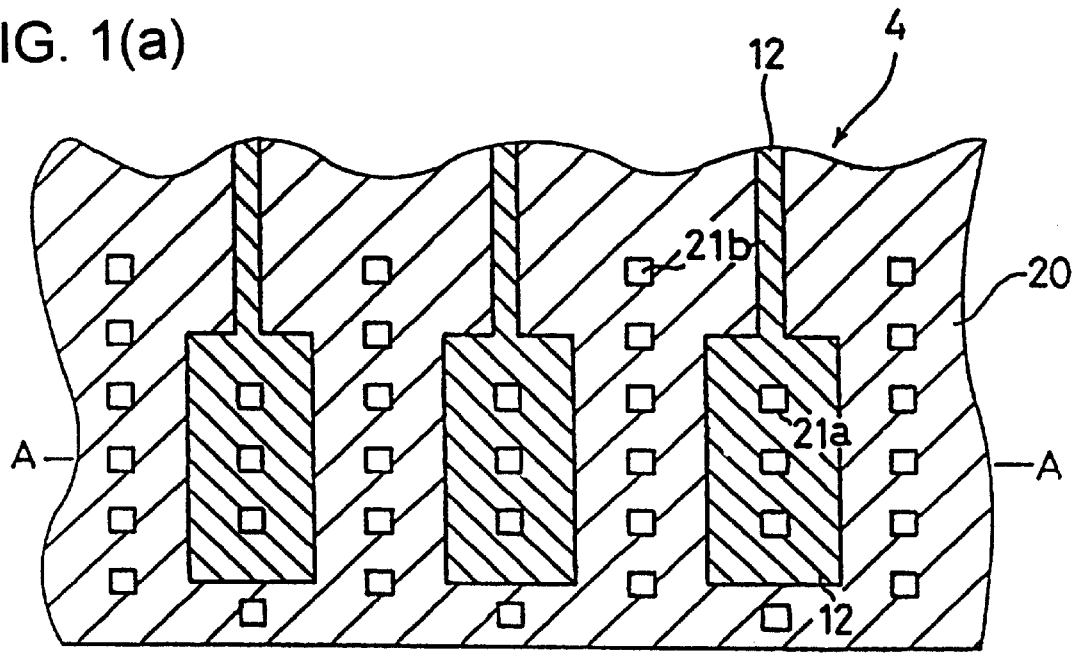
FIG. 1(a) is a plan view of a TCP film in the first exemplary embodiment of the present invention.
Figure 1B:
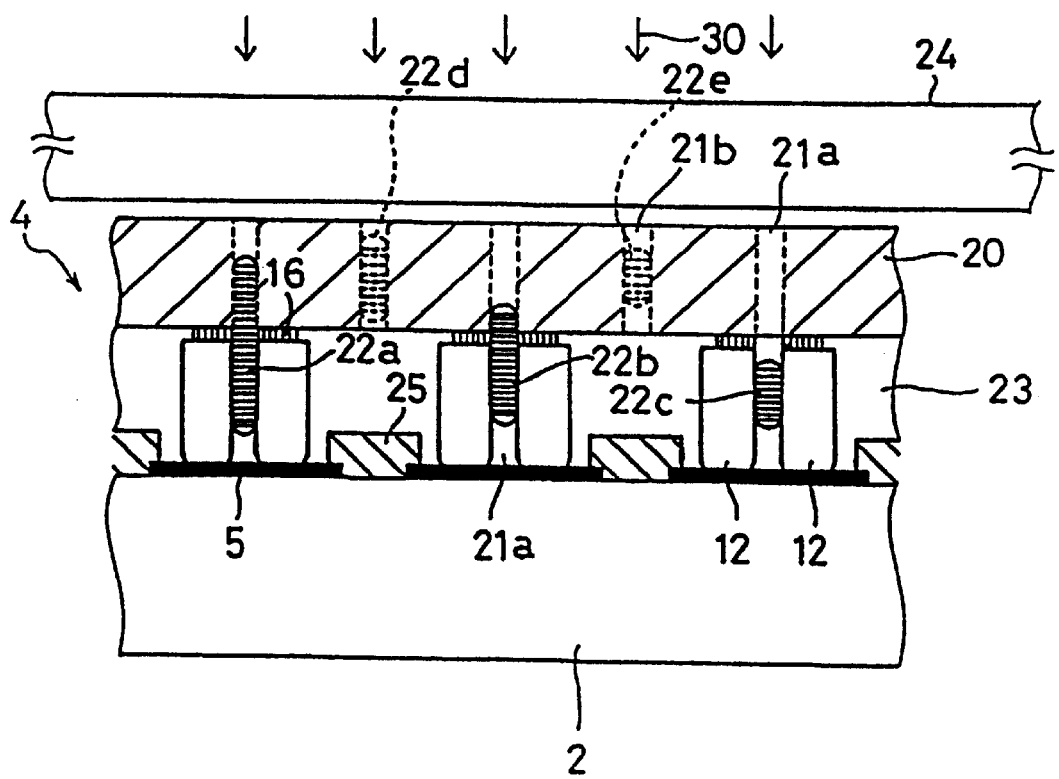
FIG. 1(b) is a cross-sectional view to illustrate a method for mounting the TCP film on an active substrate in the first exemplary embodiment.

FIG. 1(a) is a plan view of a TCP film in the first exemplary embodiment of the present invention and FIG. 1(b) is a cross-sectional view of the TCP film cut across along the line A—A in the plan view of FIG. 1(a).

As FIG. 1(b) shows, a plurality of terminal electrodes 5 are formed on an active substrate 2 and an insulating layer 25 is disposed between the adjoining two terminal electrodes 5. The insulating layer 25 includes a gate insulating layer, passivation insulating layer and other insulating layers, which are formed on the main surface of the active substrate 2, and the upper surface of each respective terminal electrode 5 is bare in almost all the area thereof by an application of selective removal of the insulating layer 25.

A TCP film to be connected to the terminal electrodes 5 is structured to have conductive patterns 12 formed on one of the surfaces of an opaque film 20 serving as a substrate.

Each respective conductive pattern 12 is formed of a wiring section and a section to hit the terminal electrode 5, and the section to hit the terminal electrode 5 is provided with openings 21a, each piercing through the opaque film 20 and conductive pattern 12. In addition, a plurality of openings 21b are provided on a section of the opaque film 20, where no conductive patterns are formed.

When the TCP film 4 thus provided with the openings 21a and 21b is mounted to the active substrate 2, a translucent resin 22 is filled into the openings 21a and 21b. It is preferred to use a resin with excellent transmissivity as the translucent resin 22. When an acrylic resin is used the translucent resin 22, for instance, the acrylic resin can be filled into the openings 21a and 21b by the use of a printing method, a pallet and the like.

The translucent resin 22 is filled into the openings 21a and 21b to prevent an ultraviolet curing resin 23 from being pushed out to the other side of the TCP film 4 via the openings 21a and 21b when the TCP film 4 is pressed onto the active substrate 2, and otherwise the TCP film 4 requires a process to flatten the surface thereof after the ultraviolet curing resin is filled in.

Nothing in particular is defined on the filling position and filling amount of the translucent resin 22 filled into the openings 21a and 21b and any filling condition of the conditions 22a to 22e as FIG. 1(b) shows is acceptable as far as the specific filling condition can prevent the ultraviolet curing resin 23 from overflowing via the openings 21a and 21b.

On the other hand, the ultraviolet curing resin 23 is applied on the active substrate 2, on which the terminal electrodes 5 and insulating layers 25 are formed, along the alignment direction of the terminal electrodes 5.

The terminal electrodes 5 on the active substrate 2 and the conductive patterns 12 of the TCP film 4 with the translucent resin 22 kept being filled into the openings 21a and 21b are joined together with a pressing force applied thereto via the ultraviolet curing resin 23.

As the method for having the TCP film 4 and active substrate 2 joined together by applying a uniform pressing force, a method of pressing down an enhanced transparency glass plate or quartz plate 24 onto the TCP film 4 can be employed to achieve the purpose intended.

Then, the joint surfaces between the conductive patterns 12 and the connecting terminals 5 are irradiated with ultraviolet rays 30 via the transluent resin 22 from the side of the TCP film 4, on which no conductive patterns 12 are formed, thereby hardening the ultraviolet curing resin 23 to complete the mounting of the TCP film 4 on the active substrate 2.

Since the conductive patterns 12 formed on the TCP film 4 are usually formed of a metallic thick film of several to several tens micrometers thick, i.e., a copper foil, for example, any ultraviolet rays, visible light rays, infrared rays and the like are not allowed to pass through the conductive patterns 12.

However, in the first exemplary embodiment, the openings 21a are formed in an area where each respective conductive pattern 12 is located and also these openings 21a are filled with the translucent resin 22, thereby allowing the ultraviolet rays 30 to get to the joint surfaces between the conductive patterns and the terminal electrodes 5 through the openings 21a and enabling the ultraviolet curing resin 23 inside the openings 21a to harden.

There exists almost none of the ultraviolet curing resin 23 at the joint surfaces between the conductive patterns 12 and the terminal electrodes 5 and therefore the conductive patterns 12 and terminal electrodes 5 are brought into direct contact with one another, thereby allowing an electrical connection to be established therebetween.

The ultraviolet curing resin 23 existing in the vicinity of the openings 21a and 21b is hardened by ultraviolet rays incident thereon from the openings 21a and 21b by diffraction, thereby enabling a contribution to joining the TCP film 4 and the terminal electrodes 5 together.

Although the joint strength between the TCP film 4 and the terminal electrodes 5 multiplies as the opening area of each respective opening 21a increases with a resulting increase in the irradiation amount of ultraviolet rays on the joint surfaces between the TCP film 4 and the terminal electrodes 5, the contact areas between the conductive patterns 12 and the terminal electrodes 5 declines instead, thereby bringing about the possibilities of enhancing the contact resistance therebetween. Therefore, it is preferred to achieve design compromises for the opening area of each respective opening 21a so as to gain both a strong connecting strength and a low value in contact resistance.

In general, by disposing many openings 21a, each measuring several micrometers in diameter, the diffracted ultraviolet rays from the rim of each respective opening 21a contribute greatly to the hardening of the ultraviolet curing resin 23, thereby enabling the enhancement in the connecting strength in spite of a reduction in opening ratio. Similarly, the openings 21b disposed in the space between the adjoining two conductive patterns 12, ie., in the opaque film 20, allow the TCP film 4 and the active substrate 2 to be joined together by adhesion via the ultraviolet curing resin 23, and therefore it is preferred to have the openings 21b disposed all over the TCP film 4 as FIG. 1(a) shows.

Thus, according to the first exemplary embodiment of the present invention, even when ultraviolet rays are irradiated from above a TCP film, the ultraviolet rays are allowed to reach the joint surfaces between conductive patterns and terminal electrodes, thereby enabling an ultraviolet curing resin existing on the joint surfaces to harden and allowing the TCP film to be mounted to display panels at a low temperature.

As a result, a thermal distortion caused to occur in a glass substrate is reduced and a brightness-dappled display can be prevented from occurring even with a liquid crystal panel of a wide viewing angle.

Second Exemplary Embodiment

Next, a description is given to a method for mounting a TCP film on a display panel in the second exemplary embodiment of the present invention.

FIG. 2(a) is a plan view of a TCP film in the second exemplary embodiment of the present invention and FIG. 2(b) is a cross-sectional view of the TCP film cut across along the line A—A in the plan view of FIG. 2(a).

In the first exemplary embodiment of the present invention, although an opaque film 20 is used as the basic material of the TCP film 4, a translucent film 10 with enhanced transparency is used as the basic material of the TCP film 4 in the second exemplary embodiment.

Thus, when the TCP film 4 is mounted on an active substrate 2 and ultraviolet rays are irradiated thereon, any openings 21 are not needed to be formed on the translucent film 10 due to the use of the translucent film 10 with enhanced transparency as the basic material for the TCP film 4, thereby ending up with disposing the openings 21 on conductive patterns 12 only.

In addition, the openings 21 disposed on the conductive patterns 12 pierce through the conductive patterns 12 extending from the areas connecting with terminal electrodes 5 to the translucent film 10 and not through the translucent film 10. Therefore, the openings 21a and 21b are no longer needed to be filled with a translucent resin as experienced with the TCP film 4 in the first exemplary embodiment.

In the same way as in the first exemplary embodiment, the connections between the conductive patterns 12 and the terminal electrodes 5 are conducted electrically as well as mechanically by irradiation with ultraviolet rays 30 via the openings 21 to harden the ultraviolet curing resin 23. However, because of the translucent insulating layer 25 disposed between two adjoining conductive patterns 12 in the present exemplary embodiment, the TCP film 4 and active substrate 2 are joined together by the ultraviolet curing resin 23 much more strongly than in the first exemplary embodiment.

Further, the openings 21 are formed at the same time as the conductive patterns 12 are formed on the translucent film 10, thereby allowing the operations of fabrication process involved to be curtailed. However, with respect to how the fabrication process is established, no restrictions are imposed thereon specifically. In addition, the small openings 21b are no longer required to be formed all over the TCP film 4 as seen in the first exemplary embodiment, thereby eliminating the necessity of filling the translucent resin 22 in the openings 21a and 21b and allowing the process of flattening the surface of the TCP film 4 to be eliminated.

Third Exemplary Embodiment

Next, a description is given to a method for mounting a TCP film to display panels in the third exemplary embodiment of the present invention.

FIG. 3 is a cross-sectional view of a TCP film in the third exemplary embodiment. In the third exemplary embodiment, the structure of ultraviolet curing resin 23 for establishing connections between the TCP film 4 and an active substrate 2 is different from those of the first and second exemplary embodiments. Except for that particular point, the method in the present exemplary embodiment is generally the same as in the first and second exemplary embodiments.

The ultraviolet curing resin 23 in the present exemplary embodiment has a minute amount (a few percent or less) of conductive fine particles 13 dispersed therein. As the conductive fine particle 13, a conductive fine particle measuring several micrometers in diameter serves the purpose. A resin bead with gold, nickel and the like attached on the surface thereof, for example, can be used advantageously as the conductive fine particle 13.

By the use of the ultraviolet curing resin 23 thus structured, the conductive patterns 12 and terminal electrodes 5 are electrically connected with one another via the conductive fine particles 13. Therefore, it is no longer necessary for the ultraviolet curing resin 23 between the conductive patterns 12 and the terminal electrodes 5 to be pushed out almost completely by a pressing force, thereby allowing any excessive force not to be exerted for mounting the TCP film 4 on the active substrate 2 by pressing.

In addition, there exists some ultraviolet curing resin 23 in the vicinity of joint surfaces between the conductive patterns 12 and the terminal electrodes 5 and, therefore, in order to ensure hardening of the ultraviolet curing resin 23 by irradiation of ultraviolet rays 30, it is necessary for the irradiation amount of the ultraviolet rays 30 to be increased or for the efficiency of hardening of the ultraviolet curing resin 23 to be enhance by diffraction of the ultraviolet rays 30 irradiated via the openings 21.

Since many of the conductive fine particles 13 are generally formed of opaque materials, a large amount of the conductive fine particles 13 dispersed in the ultraviolet curing resin 23 results in an extensive reduction in transmissivity of the ultraviolet rays 30 and a decline in the amount of ultraviolet irradiation for hardening the ultraviolet curing resin 23 and an excessively small amount of the conductive fine particles 13 causes enhanced electrical resistance, thereby requiring the mixing ratio of the conductive fine particle 13 to the ultraviolet curing resin 23 to be adjusted so as to realize the most suitable strength of adhesion and gain a low value in electrical resistance.

Although a description is given in the present exemplary embodiment with respect to an example, in which the TCP film 4 as used in the second exemplary embodiment is employed, the validity of the description made in the present exemplary embodiment is not restricted by the particular TCP film 4 of above and the same effect can be gained by the use of the TCP film 4 as used in the first exemplary embodiment.

Although in each of the foregoing first to third exemplary embodiments, a description is given to an example, in which an active type color liquid crystal panel is employed as the display panel, the effectiveness of the present invention is not restricted to this particular type of display panel but the same effect can be obtained with an IPS type liquid crystal panel that does not require translucent conductive pixel electrodes, a simple type liquid crystal panel with no active elements built in or a reflective type liquid crystal panel.

Also, the same effect as above can be obtained with a liquid crystal panel, in which a colored layer is formed on the active substrate for color displaying.

Furthermore, with a light emitting type matrix panel such as a PDP (Plasma Display Panel), an EL (Electro-Luminescent) panel and the like, the same effect as described in the first to third exemplary embodiments with respect to the method for mounting a TCP film according to the present invention can be obtained. Even with these display devices, terminal electrodes for packaging are disposed on one of the main surfaces of the rims of one of the glass substrates because electrical signals are fed from a driving semiconductor integrated circuit to scanning lines and signal lines via some connecting means.

Thus, according to the present invention, it is obvious that a photo-curing resin existing on the joint surfaces between conductive patterns and terminal electrodes can be exposed to light even if the light rays is irradiated from the above of a TCP film, thereby allowing the photo-curing resin on the joint surfaces to harden and enabling the packaging process to be carried out at a low temperature.

As a result, the thermal distortions caused to occur on the glass substrate are reduced, thereby allowing a display panel with a wide viewing angle to prevent a brightness-dappled display. Although making the mounting temperature lower is greatly dependant on the amount and period of light irradiation, it is not difficult for at least the temperature, under which the region exposed to light is receiving a light irradiation treatment, to be kept at 100° C. or lower.

In addition, according to the present invention, by having conductive fine particles dispersed in a photo-curing resin for joining a TCP film and an active substrate together, conductive patterns and terminal electrodes are not required to be completely adhered to one another, thereby achieving the effect of not only mitigating the condition of adhesion of the TCP film by pressing but also eliminating the necessity of enhancing the strength of the TCP film.

The effectiveness of the present invention is not restricted to an active type color liquid crystal panel but the same effect can be obtained with such liquid crystal panels an IPS type liquid crystal panel that does not require translucent conductive pixel electrodes, a simple type liquid crystal panel with no active elements built in, a reflective type liquid crystal panel regardless of an active type or a simple type and further a liquid crystal panel, in which a colored layer is formed on the active substrate for color displaying.

Also, the same effect can be obtained with such light emitting type matrix panels as a PDP, an EL panel and the like.

What is claimed is:

1. A method for mounting a TCP on a display panel comprising a step of establishing connections between terminal electrodes of a liquid crystal panel, which is formed of an active substrate and an opposing color filter substrate with liquid crystal filled therebetween, and a TCP film formed of an opaque film substrate with a conductive pattern formed on a surface thereof, wherein the active substrate comprises:
 a first translucent insulating substrate;
 a plurality of scanning lines disposed on a main surface of the first translucent insulating substrate;
 a plurality of signal lines intersecting generally at a right angle with the scanning lines, respectively;
 at least a layer or more of insulating layer sandwiched between the scanning lines and the signal lines;
 at least a switching element and pixel at each respective point of intersection of the scanning line and signal line; and
 terminal electrodes of the scanning lines and signal lines disposed outside an image display area of the active substrate, and wherein the color filter substrate opposing to the active substrate, comprises:
 a second translucent insulating substrate with a translucent conductive layer disposed on a main surface thereof; or
 the second translucent insulating substrate with a color filter layer formed thereon, wherein, when the conductive pattern of the TCP film and the terminal electrodes are connected with one another via a photo-curing resin, an opening formed on the opaque film substrate and also on the conductive pattern is filled with a translucent resin and applied with a pressing force to establish connections between the conductive pattern of the TCP film and the terminal electrodes, and light rays are irradiated on joint surfaces between the conductive pattern and the terminal electrodes through the translucent resin from a side opposite to a surface of the TCP film provided with the conductive pattern, thereby hardening the photo-curing resin.

2. The method for mounting a TCP film on a display panel according to claim 1, wherein a photo-curing resin containing conductive fine particles is used as an adhesive material for joining the conductive pattern and terminal electrodes together.

3. The method for mounting a TCP film on a display panel according to claim 1, wherein the display panel is any one of an IPS type liquid crystal panel that does not require translucent conductive pixel electrodes, a simple type liquid crystal panel with no active devices built in, a reflective type liquid crystal panel and a liquid crystal panel with a coloring layer for color display formed on the active substrate.

4. A method for mounting a TCP film on a display panel comprising a step of establishing connections between terminal electrodes of a liquid crystal panel, which is formed of an active substrate and an opposing color filter substrate with liquid crystal filled therebetween, and a TCP film formed of a translucent film substrate with a conductive pattern formed on a surface thereof, wherein the active substrate comprises:
 a first translucent insulating substrate;
 a plurality of scanning lines disposed on a main surface of the first translucent insulating substrate;
 a plurality of signal lines intersecting generally at a right angle with the scanning lines, respectively;
 at least a layer or more of insulating layer sandwiched between the scanning lines and the signal lines;
 at least a switching element and pixel at each respective point of intersection of the scanning line and signal line; and
 terminal electrodes of the scanning lines and signal lines disposed outside an image display area of the active substrate, and wherein the color filter substrate opposing to the active substrate, comprises:
 a second translucent insulating substrate with a translucent conductive layer disposed on a main surface thereof; or
 the second translucent insulating substrate with a color filter layer formed thereon, wherein, when an opening is formed on the conductive pattern of the TCP film and the conductive pattern of the TCP film and the terminal electrodes are joined together by pressing against one another via a photo-curing resin, light rays are irradiated on joint surfaces between the conductive pattern and the terminal electrodes from a side opposite to a surface of the TCP film provided with the conductive pattern while keeping the conductive pattern to be pressed onto the terminal electrodes, thereby hardening the photo-curing resin.

5. A method for mounting a TCP film on a display panel comprising a step of establishing connections between terminal electrodes of a display panel, which comprises a plurality of scanning lines, a plurality of signal lines intersecting generally at a right angle with the scanning lines, respectively, and terminal electrodes of the scanning lines and signal lines disposed outside an image display area of the display panel, and a TCP film formed of an opaque film substrate with a conductive pattern formed on a surface thereof, wherein, when the conductive pattern of the TCP film and the terminal electrodes are connected with one another via a photo-curing resin, an opening formed on the opaque film substrate and also on the conductive pattern is filled with a translucent resin and applied with a pressing force to establish connections between the conductive pattern of the TCP film and the terminal electrodes and light rays are irradiated on joint surfaces between the conductive pattern and the terminal electrodes through the translucent resin from a side opposite to a surface of the TCP film provided with the conductive pattern, thereby hardening the photo-curing resin.

6. The method for mounting a TCP film on a display panel according to claim 5, wherein the display panel is a light emitting type matrix display panel such as a PDP, an EL panel and the like.

7. The method for mounting a TCP film on a display panel according to claim 6, wherein the photo-curing resin used as an adhesive material to join a conductive pattern and terminal electrodes together contains conductive fine particles.

8. A method for mounting a TCP film on a display panel comprising a step of establishing connections between terminal electrodes of a display panel, which comprises a plurality of scanning lines, a plurality of signal lines intersecting generally at a right angle with the scanning lines, respectively, and terminal electrodes of the scanning lines and signal lines disposed outside an image display area of the display panel, and a TCP film formed of a translucent film substrate with a conductive pattern formed on a surface thereof, wherein, when the conductive pattern of the TCP film and the terminal electrodes are connected with one another via a photo-curing resin, an opening is formed on the conductive pattern of the TCP film and the conductive pattern of the TCP film and the terminal electrodes are joined together by pressing against one another via a photo-curing resin, light rays are irradiated on joint surfaces between the conductive pattern and the terminal electrodes from a side opposite to a surface of the TCP film provided with the conductive pattern wbile keeping the conductive pattern to be pressed onto the terminal electrodes, thereby hardening the photo-curing resin.

9. The method for mounting a TCP film on a display panel according to claim 5 or claim 8, wherein the photo-curing resin used as an adhesive material to join a conductive pattern and terminal electrodes together contains conductive fine particles.

* * * * *